United States Patent [19]

Fuller

[11] Patent Number: 4,971,928

[45] Date of Patent: Nov. 20, 1990

[54] METHOD OF MAKING A LIGHT EMITTING SEMICONDUCTOR HAVING A REAR REFLECTING SURFACE

[75] Inventor: Brian K. Fuller, Washington, Mich.

[73] Assignee: General Motors Corporation, Detroit, Mich.

[21] Appl. No.: 466,108

[22] Filed: Jan. 16, 1990

[51] Int. Cl.$^5$ .................... H01L 21/20; H01L 21/203
[52] U.S. Cl. .......... 437/129; 148/DIG. 26, DIG. 95; 148/DIG. 106; 156/610; 437/81; 437/89; 437/132; 437/962
[58] Field of Search .................. 148/DIG. 25, 26, 50, 148/56, 65, 72, 95, 97, 99, 105, 106, 110, 169; 156/610-614; 357/16, 17; 372/43, 46, 48, 50; 427/248.1, 252, 255.1, 255.2; 437/81, 82, 83, 99, 126, 89, 90, 132, 133, 127, 905, 976, 962

[56] References Cited

U.S. PATENT DOCUMENTS

| | | | |
|---|---|---|---|
| 4,178,197 | 12/1979 | Marinace | 437/89 |
| 4,420,873 | 12/1983 | Leonberger et al. | 437/89 |
| 4,426,767 | 1/1984 | Swanson et al. | 437/90 |
| 4,551,394 | 11/1985 | Betsch et al. | 437/90 |
| 4,587,717 | 5/1986 | Daniele et al. | 437/90 |
| 4,774,205 | 9/1988 | Choi et al. | 437/99 |
| 4,826,784 | 5/1989 | Salerno et al. | 437/89 |
| 4,837,182 | 6/1989 | Bozler et al. | 437/82 |
| 4,891,093 | 1/1990 | Smith | 156/613 |
| 4,910,164 | 3/1990 | Shichijo | 437/90 |

FOREIGN PATENT DOCUMENTS

| | | | |
|---|---|---|---|
| 0011621 | 1/1984 | Japan | 437/89 |
| 0066810 | 3/1985 | Japan | 437/89 |
| 0284913 | 12/1986 | Japan | 437/89 |
| 0295624 | 12/1986 | Japan | 437/89 |

OTHER PUBLICATIONS

Ishiguro et al., "High efficient GaAlAs light-emitting diodes of 660 nm with a double heterostructure on a GaAlAs substrate", Appl. Phys. Lett. 43(11), Dec. 1, '83.

Asai, "Anisotropic Later Growth in GaAs MOCVD Layers on (001) Substrates", Journal of Crystal Growth 80 (1987), 425-433, North-Holland, Amsterdam.

Gale et al., "Later epitaxial overgrowth of GaAs by organometallic chemical vapor deposition", Appl. Phys. Lett., vol. 41, No. 6, 15 Sept. '82.

Cheng et al., "Aspects of GaAs Selective Area Growth by Molecular Beam Epitaxy with Patterning by SiO$_2$ Masking", J. Electrochem. Soc.: Solid-State Science and Technology, vol. 130, No. 10, Oct. '83.

Asai et al., "Lateral Growth Process of GaAs over Tungsten Gratings by Metalorganic Chemical Vapor Deposition", J. Electrochem. Soc.: Solid-State Science and Technology, vol. 132, No. 10, Oct. '83.

McClelland et al., "A Technique for Producing Epitaxial Films on Reusable Substrates", Appl. Phys. Lett., 37(6), Sep. 15, 1980, pp. 560-2.

Gale et al. "Lateral Epitaxial Overgrowth of GaAs and GaAlAs . . . " Inst. Phys. Conf. Ser. No. 65, Paper presented at Int. Symp. GaAs and Related Compounds, Albuquerque, 1982, pp. 101-108.

*Primary Examiner*—Olik Chaudhuri
*Assistant Examiner*—William Bunch
*Attorney, Agent, or Firm*—Domenica N. S. Hartman

[57] ABSTRACT

A light emitting semiconducting structure is formed over a light reflecting surface using epitaxial growth techniques. The light reflecting surface is provided by an appropriate metal layer intermediately disposed between two dielectric layers, this multi-layer structure is disposed intermediate between an underlying substrate and the overlaying light emitting semiconducting components. The light reflecting surface provides enhanced photon reflectance for the light emitting device. The active region of the light emitting device is formed using epitaxial growth techniques.

5 Claims, 2 Drawing Sheets

METHOD OF MAKING A LIGHT EMITTING SEMICONDUCTOR HAVING A REAR REFLECTING SURFACE

This invention relates to a method for forming light emitting semiconductor structures, particularly, to a method for forming a light emitting diode or surface emitting laser having a rear reflecting surface.

BACKGROUND OF THE INVENTION

Light emitting diodes (LEDs) are currently produced using epitaxial crystal growth techniques, such as liquid phase epitaxy (LPE), vapor phase epitaxy (VPE), molecular beam epitaxy (MBE), and metallo-organic chemical vapor deposition (MOCVD). With any of these techniques, epitaxial layers are grown on a substrate. The substrates are generally chosen to be lattice matched with the epitaxial layer. As an example, layers of the material $Al_xGa_{1-x}As$ are grown on gallium arsenide (GaAs) substrates because this combination of materials offers good lattice match for all values of x, and good light transmittance.

Unfortunately, a significant drawback exists. In many instances, the substrate may appreciably absorb that wavelength range of photon that the light emitting diode emits. This is true with AlGaAs, GaAsP, and InGaP active regions. This is also true for quantum well heterostructure (QWH) such as in the AlGaAs/GaAs or AlInGaP/InGaP material systems grown on GaAs substrates. The active region composition and thickness determines the wavelength of transmitted light for the light emitting structure. For example, photons produced in the active epitaxially grown AlGaAs region which are directed toward the GaAs substrate are absorbed by the GaAs substrate. Naturally, absorbed photons do not contribute to the device light output. If these otherwise absorbed photons could be utilized, the light emitting efficiency of a light emitting diode would increase substantially.

As a solution to this problem, previous work has been attempted to grow a thick transmissive epitaxial layer above an absorbing substrate, and then subsequently removing the substrate material. By etching the original substrate material away before packaging the light emitting diode, light may be extracted from both the top and bottom surfaces of the device. However, such an approach is impractical since it is time consuming both with respect to the duration of crystal growth and post growth device processing.

An alternative and more practical solution would be to form a reflecting surface above an appropriate substrate prior to selective growth of the light emitting layer. This reflecting surface could be used to increase the light output of the light emitting diode, such as formed by AlGaAs on GaAs or InGaP on GaAs. Such a reflector would redirect those photons directed toward the substrate to the surface of the device. Without redirection, these photons would be lost to the absorbing substrate. Such a reflector could also be used as the rear mirror of a surface emitting laser.

It is foreseeable that selective crystal growth techniques could be used to form such a rear reflecting surface. Selective crystal growth techniques have been used to control the location of epitaxial crystal deposition on patterned materials. The selective crystal growth results in epitaxial growth of the desired material on a patterned substrate without simultaneous material deposition on the pattern forming mask.

Therefore it would be desirable to provide a method for forming a light emitting diode having a rear reflecting surface so as to enhance light reflectance of the light emitting diode. It would also be desirable to provide such a method which utilizes selective epitaxial crystal growth techniques.

SUMMARY OF THE INVENTION

It is an object of this invention to provide a method for forming light emitting diodes having a rear reflecting surface.

It is a further object of this invention that such method use selective epitaxial crystal growth techniques.

In accordance with a preferred embodiment of this invention, these and other objects and advantages are accomplished as follows.

I am the first to form a light emitting semiconducting structure, such as a light emitting diode, having a light reflecting rear surface using epitaxial growth techniques. This is accomplished by the following preferred steps. First, a substrate of appropriate semiconductive material and conductivity is provided. In one embodiment, a sandwiched structure is then deposited on top of this substrate and patterned. The sandwiched structure contains a reflecting layer disposed between two dielectric layers. The sandwiched structure is patterned so as to expose selected regions of the underlying substrate. The pattern may be in the form of parallel stripes, an array of dots, or other appropriate pattern. A material which is compatible with the underlying substrate is then epitaxially grown from the exposed regions of the substrate to a height roughly equal to the thickness of the sandwiched structure, and then allowed to continue growing epitaxially over the sandwiched structure in a lateral direction. This lateral growth proceeds with nucleation only on the original selectively grown crystal, not on the dielectric mask. Polycrystalline deposits on the mask would interfere with the crystalline perfection of the laterally grown film. The laterally grown layer serves as the lowest layer of the heterostructure supporting the active region. Once lateral growth of this layer is complete, the remaining growth of the light emitting active region proceeds normally, in a direction perpendicular to the substrate. The additional components of the light emitting semiconducting structure, such as electrical contacts, are then conventionally deposited on top of this laterally grown epitaxial layer. This method is useful for forming light emitting diodes or surface emitting lasers depending on the materials and parameters chosen.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawings wherein.

DESCRIPTION OF THE PREFERRED EMBODIMENTS

Figure 1:
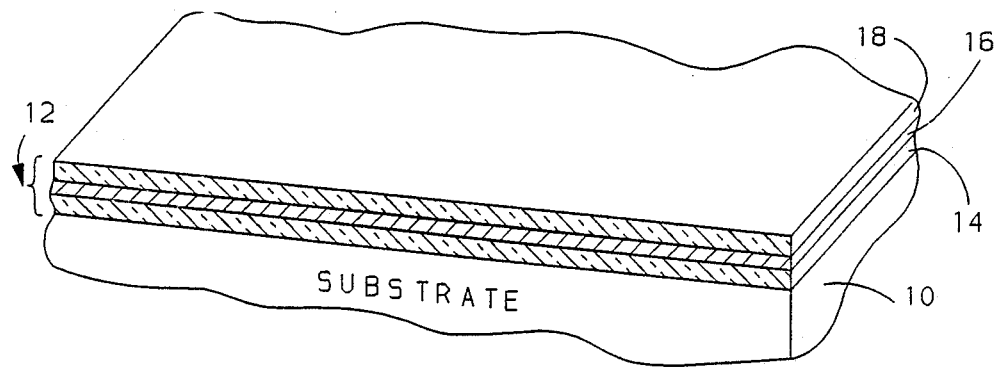
FIGS. 1-5 schematically illustrate the preferred processing steps in accordance with a preferred method of this invention for forming a rear reflecting light emitting semiconducting structure.

With this invention, selective epitaxial growth techniques are used to form a light emitting semiconducting structure which is grown over a light reflecting structure having a light reflecting surface. Generally, a preferred embodiment of this invention entails a sandwiched structure containing an intermediately disposed reflecting layer surrounding by two dielectric layers. The sandwiched structure is provided on an appropriate substrate, both with respect to crystallographic orientation and material. The sandwiched structure is patterned so as to expose the underlying substrate. Selective growth commences with an appropriate material epitaxially nucleating only on exposed substrate surfaces within windows etched through the dielectric sandwich. Deleterious polycrystalline nucleation on dielectric mask material is suppressed through proper choice of growth chemistry and growth parameters. Once the initial material grows above the dielectric mask, lateral lower heterobarrier growth commences. This barrier suppresses carrier recombination at dangling surface bond sites where bonding to the mask did not occur. Improved carrier isolation to the dangling bond area could be achieved by making the barrier material or that grown immediately after semi-insulating, thus electrically isolating the device to layers above this barrier. Electrical activation for this isolated device would proceed laterally across the wafer with surface n and p type electrical contacts. A simpler top to bottom through the substrate current path, laterally grown rear reflector light emitting diode structure will be detailed in the figures presented here.

The pattern design on the underlying substrate for guiding the selective growth may vary depending on the ultimate device design. For convenience, a parallel pattern of stripes etched through the dielectric-metal-dielectric sandwich is preferred. The stripes are openings in the sandwich, exposing the substrate below. Proper selection of the interstripe spacing dimension allows achievement, in a reasonable amount of time and if desired, of the laterally growing crystal facets from adjacent stripes to merge. Selected growth conditions during the lateral growth stage favor the lateral growth rate over the substrate to the growth rate perpendicular to the substrate, in addition to voidless facet merging. When the facets have merged, a continuous laterally grown film exists over the entire patterned area of the substrate. Subsequent epitaxial growth proceeds only in the direction perpendicular to the substrate. At this time, growth parameters formerly held to achieve selective epitaxy and lateral growth may be relaxed.

The mask stripe width is chosen to avoid current crowding when electrical conduction occurs through the substrate. Stripe width may be made narrow to suppress threading dislocation multiplication when mismatched substrate/epitaxial layer combinations are used. An array of dots or other appropriate pattern could also be used as the selective growth pattern. The pattern's only requirement is that it must support lateral epitaxial growth by exposing the proper crystal planes of the selectively growing layer. Conceivably, with very narrow stripes, or small enough diameter dot pattern, an amorphous substrate, such as glass, could be used and still result in single crystal epitaxy above. In this way, one would form an efficient light emitting rear reflector directly on say glass, instead of the conventional single crystal substrate. The amorphous substrate could be chosen for cost, handling ease, or heat sinking advantage.

The electrical contact pattern should maximize device light output by: minimally blocking output photons and maximizing the injected current distribution for enhanced active region excitation.

A first preferred reflecting sandwich structure is generally described. This first preferred structure includes a sandwiched multi-layer, dielectric/metal/dielectric structure deposited on an appropriate substrate, such as gallium arsenide or silicon. The sandwiched structure includes a thin metal layer, such as gold, deposited between two dielectric layers, such as silicon oxide, aluminum oxide, other oxides, silicon nitride, aluminum nitride, and other nitride compounds. The metal layer serves as the photon reflector for the overlaying light emitting semiconductor structure. The bottom dielectric layer must be capable of adhering well to the underlying substrate. Both dielectric layer materials must be inert to the metal sandwiched between. The dielectrics might also be chosen to minimize stress due to lattice mismatch with the substrate. The top dielectric layer material is also chosen to suppress polycrystalline nucleation during the selective and lateral growth steps. The metal layer is sandwiched between the dielectric layers to prevent substrate interaction, or alloying, between the metal layer and the substrate or the overlaying laterally grown epitaxial layer during device processing. Alloying must be prevented since it might destroy the reflectivity of the reflecting layer.

A second, equally preferred reflecting structure for use in a light emitting semiconductor is also disclosed. An epitaxial stack of alternating semiconducting layers having differing indices of refraction is grown on a substrate and then patterned for selective epitaxial material growth. The epitaxial stack has a thickness of a quarter wavelength, wherein the wavelength is of the emitted photon from the light emitting semiconductive structure.

The first preferred reflecting structure containing the dielectric/metal/dielectric sandwiched structure is more appropriate for the formation of a light emitting diode. A light emitting diode is characterized by a radiative output having a broad wavelength spread, since light is generated from spontaneously emitted photons. Because the metal reflecting layer within this reflecting structure is capable of reflecting a broad band of wavelengths, such as infrared and ultraviolet among others, this structure is more suitable for use with the light emitting diode.

Alternatively, the second preferred reflecting structure containing the quarter wavelength stack of semiconducting layers would be more appropriate for use within a laser rather than a light emitting diode. This is true since a laser's light output is nearly monochromatic, due to stimulated emission, and the quarter wavelength reflecting stacks tend to be quite wavelength specific. Because of this, broad spectrum LED emission would not be as effectively reflected as would narrow spectrum laser emission.

A preferred method for forming the light emitting semiconducting structure having one of the above reflecting structures with rear reflecting surface is now detailed.

For this detailed description, the first preferred reflecting structure containing the dielectric/metal/dielectric sandwiched reflective structure will be used as an exemplary embodiment.

As shown in FIG. 1, a reflecting sandwiched structure 12 is deposited on a substrate 10. First, a thin dielectric layer 14 is deposited on the surface of the substrate 10. Then a thin layer 16 of reflecting metal is deposited upon the first dielectric layer 14. The metal layer 16 is then capped by a second dielectric layer 18. The substrate 10 may be any appropriate material which will later support epitaxial growth. The use of gallium arsenide, or other suitable substrate materials, such as silicon, may be used depending upon application. The preferred dielectric materials for both dielectric layers 14 and 18 is aluminum oxide due to present surface chemistry limitations. However, the choice of dielectrics is not limited to aluminum oxide alone. Aluminum oxide adheres well to the underlying substrate 10 and also subsequently permits good lateral epitaxial growth over the top layer 18 while preventing any undesirable alloying between the intermediate metal layer 16 and surrounding materials. The preferred metal for the intermediate reflecting layer 16 is gold because of its chemical stability and reflectivity of a broad band of wavelengths, however other suitable reflective metals may also be used.

Figure 2:
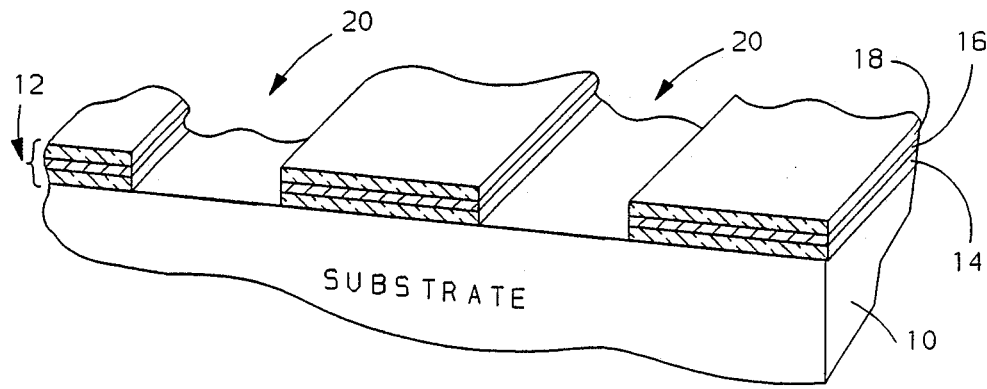

As shown in FIG. 2, the dielectric/metal/dielectric structure 12 is then patterned using conventional photolithographic techniques, exposing the underlying substrate 10 in desired areas 20 and leaving the sandwiched structure 12 intact elsewhere. The dielectric/metal/dielectric reflecting structure 12 is photolithographically patterned to form a selective mask pattern consisting of parallel stripes 20 in the preferred embodiment. The selective mask pattern itself and its orientation on the substrate 10 are chosen so that it will support subsequent epitaxial growth of the desired crystalline planes and to provide a reasonable lateral growth velocity. For itemization of these selective growth parameters, it is preferred that selective epitaxial growth occur from stripes so oriented and a substrate 10 whose surface offers exposed lateral, fast growing facets through selective epitaxy. For example, in GaAs selective lateral growth, a (110) oriented substrate, having stripes whose long dimension runs about 20° from the [110] direction has been shown to promote lateral growing facets.

Figure 3:
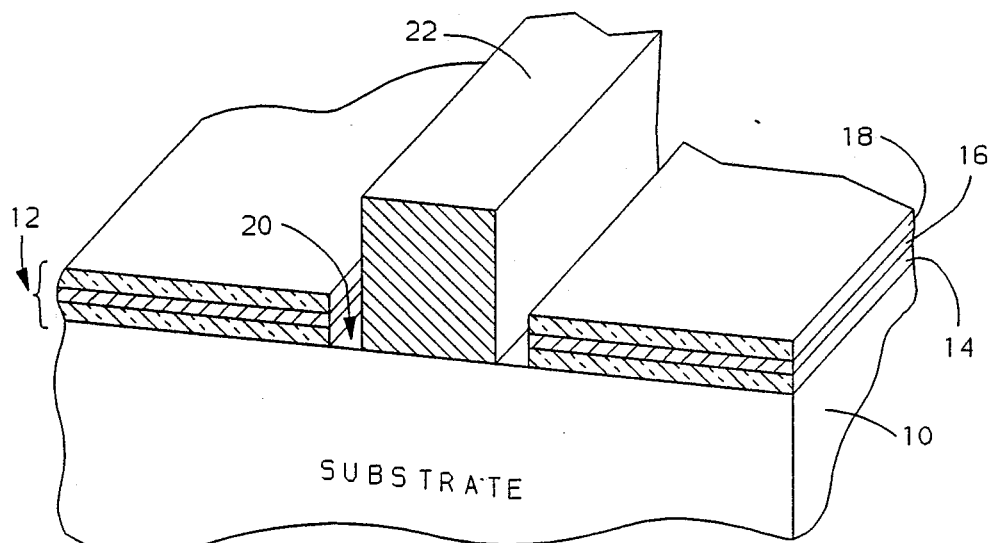

The patterned substrate 10, made free of surface contamination beyond the dielectric/metal/dielectric reflecting structure 12 itself, will now be selectively and epitaxially grown upon using a crystal growth technique such as MOCVD, MBE, VPE, LPE, or some variant thereof. Deposition parameters for the various methods are chosen to support selective growth on the designated, exposed surfaces 20 of the underlying substrate 10, as shown in FIG. 3, but not on the dielectric/metal/dielectric mask 12.

The initial selectively grown epitaxial material 22 need not be transparent to active region radiation, as no photon reflecting layer exists beneath. It is desirable though, that the laterally grown layer 24 be transparent to active region generated photons. Layer 24, which is a portion of a double heterostructure, may be made of AlGaAs.

In Al(x)Ga(1−x)As, as x increases, the more transmissive the layer is to the active region photons due to increasing bandgap. For quantum well heterostructures made in the AlGaAs/GaAs material system, the larger the value of x in the confining region, the more visible light can be extracted from the well. However, selective growth of AlGaAs with x>0.35 is a current source of difficulty, and has not yet been demonstrated. This fact complicates the formation of higher Al containing AlGaAs/GaAs QWH by the selective growth technique. I believe this limitation may be alleviated by modifying a combination of growth chemistry and growth parameters.

If the composition of layer 24 cannot be grown selectively to be as transmissive as desired, a thin layer of that composition having maximum transmission can be selectively grown. Adjust the growth parameters to yield maximum lateral vs. perpendicular growth rates without material quality degradation. Absorption losses are thus minimized by presenting a thin absorbing layer between the active region and buried metallic photon reflector.

Figure 4:
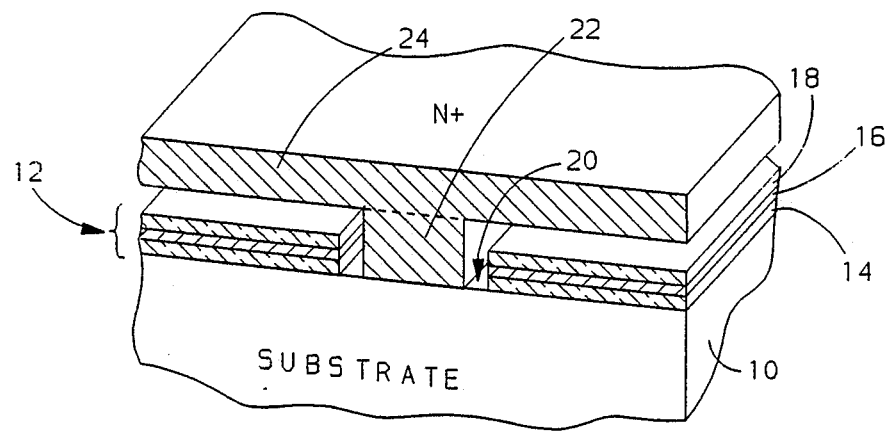

As shown in FIG. 4, once the initial selectively grown epitaxial crystal layer 22 within the exposed columns 22 of the substrate 10, extends above the dielectric/metal/dielectric mask 12 top surface, selective lateral growth 24 may proceed over the top layer 18 of the dielectric/metal/dielectric reflecting structure 12. Once the lateral epitaxial growth of layer 24 is complete, the active region 26 may be grown. The wavelength of light emitted from the structure depends both upon the active region thickness as well as the active region composition, assuming adequate barrier (24 and 28) confining energy heights.

Figure 5:
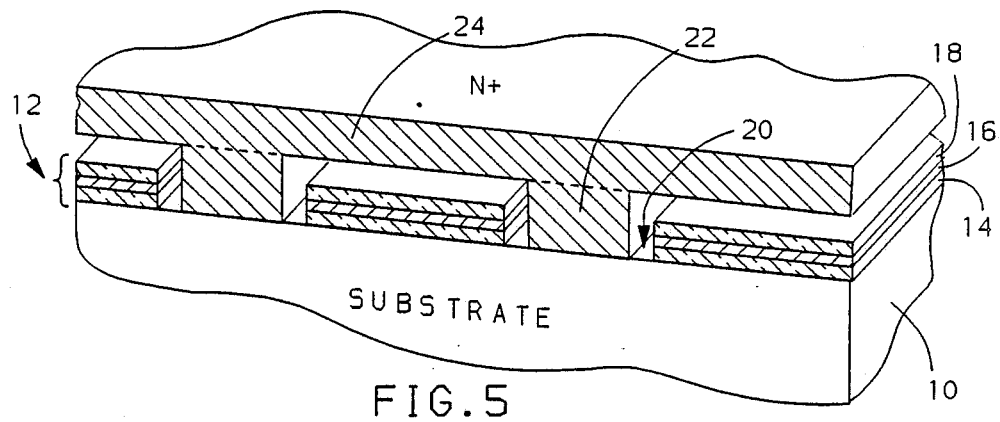

Growth parameters may require adjustment to suit lateral growth 24 above the reflecting structure 12 while avoiding nucleation on the reflecting structure 12. In addition, if there is any stress associated with the epitaxial growth of a material which is not identical to the substrate 10, i.e., epitaxial AlGaAs on GaAs or epitaxial InGaP on GaAs or either of these epitaxial materials on a silicon substrate, within the exposed columns 20 of the substrate 10, the stresses are relieved during this lateral 24 epitaxial growth and the crystallographic lattices tend to relax toward their unstressed dimensions. The resulting epitaxially grown active region 24 is shown in FIG. 4. The lateral active region 24 is of a preferred N+ conductivity grown from a substrate characterized by n-type conductivity. Layer 26 is typically undoped while layer 28 is doped P+ for formation of the desired PN junction LED. A preferred example is the AlGaAs epitaxially grown from the GaAs substrate. It is to be noted that the lateral growth may be terminated at any time by removing the deposition parameters, when the desired light emitting size is obtained. The stripe-to-stripe spacing of a parallel stripe mask 20 may be chosen to allow a continuous lateral epitaxial layer 24 or film to form, as shown in the preferred embodiment of FIG. 5. The spacing must be close enough to allow a continuous epitaxial film 24 to form in a reasonable time above the dielectric/metal/dielectric reflecting structure 12. Further crystal growth would then serve only to thicken the epitaxial active region 24 to that desired. FIG. 5 illustrates a continuous, selectively grown epitaxial region 24.

Figure 6:
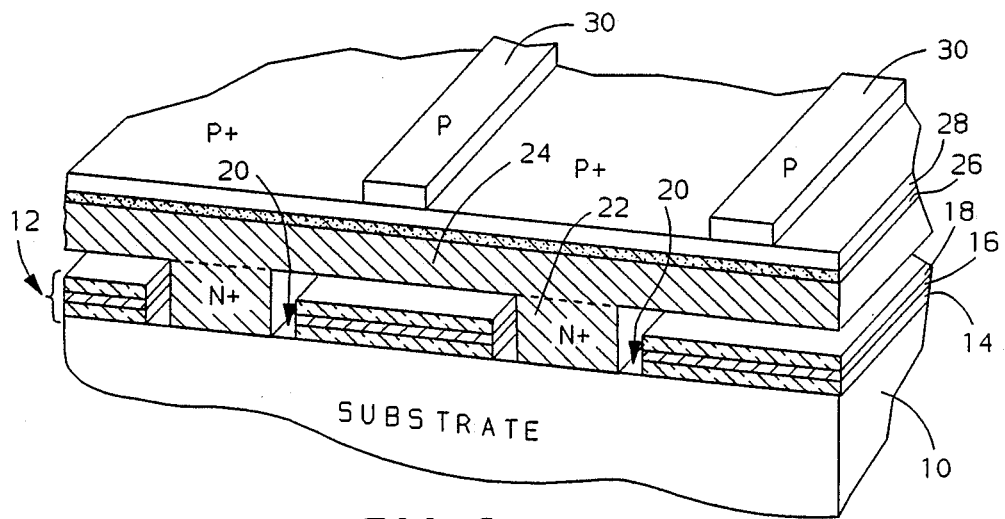
FIG. 6 shows a preferred embodiment of a light emitting diode having a rear reflecting surface in accordance with this invention.

As shown in FIG. 6, the remaining components 26 and 28 forming the device active region are deposited upon the overlaying, epitaxial layer 24, and the overall device structure is illustrated. This device structure serves as a photon reflector 12 for the active region (24, 26 and 28) above the reflective surface 16 within the dielectric/metal/dielectric structure 12. Photons initially directed toward the substrate 10 are redirected toward the surface of the light emitting semiconductor. Following formation of the desired components, conventional electrical contacts 30 are deposited between the original striped openings 22 of the dielectric/metal/dielectric reflecting structure 12.

As shown in the preferred embodiment, a double heterostructure provides efficient carrier injection and confinement. In this manner, minority carriers are kept from exposed crystal surfaces. It should be noted that the low bandgap epitaxial layer 22, which was initially grown in the striped openings or channels 20, should not be allowed to overgrow and obscure any of the reflecting surface 16.

FIG. 6 illustrates the direction of the electrical current path. The device current path passes from the top electrical contacts 30, through the laterally grown material or active region 24, and into the conducting substrate 10 through the selectively grown epitaxial channels 22. The emitter may be chosen to use an n or p-type substrate 10 depending on the desired applications. The n and p-type semiconducting regions may be reversed as a whole if use of a p-type substrate is desired.

Device contact resistance may be reduced by adding a heavily doped low bandgap layer only beneath the electrical contact regions. This might be more easily accomplished by utilizing a contacting technology where In, among other elements, is deposited and alloyed into layer 28, forming the top electrical contacts. In additions lowers the bandgap for III-V semiconductors containing Al and/or Ga.

As a standard practice for a light emitter diode, a material, typically epoxy, whose refractive index is between that of air and the semiconductor would then be deposited to enhance optical output coupling efficiency. If a laser structure is desired, a partially reflective mirror would be formed above the active region.

Although it is preferred to use selective epitaxial growth techniques for formation of the light emitting semiconductor structure having the rear reflecting surface, it is foreseeable that other techniques could also be used to form this desired device. Semiconductor active regions have been isolated and mounted using lift-off techniques on substrates other than that substrate used to grow the epitaxial semiconductor region. Using lift-off techniques, the semiconductor active region is removed from the substrate upon which epitaxial growth took place and mounted on an alternative substrate. The alternative substrate may be characterized by high reflectivity, enhanced conductivity, or any other desired characteristic. In addition, the lift-off active region may be mounted on curved or other geometrically shaped surfaces to form a variety of devices.

With this invention, light emitting semiconducting structures, such as light emitting diodes or lasers, having a rear reflecting surface are formed. While our invention has been described in terms of preferred embodiments, it is apparent that other forms could be adopted by one skilled in the art, such as by modifying desired electrical conductivities, materials or processing parameters such as the lift-off techniques. Accordingly the scope of our invention is to be limited only by the following claims.

The embodiments of the invention in which an exclusive property or privilege is claimed are defined as follows:

1. A method for forming a light emitting semiconducting structure comprising the following steps:
   providing a substrate of appropriate semiconductive material, conductivity and crystallographic orientation;
   patterning a reflecting structure which overlays said substrate, said patterned reflecting structure comprising a reflecting layer disposed between two dielectric layers such that a first dielectric layer contacts said substrate, said reflecting structure being patterned so as to expose at least one region of said underlying substrate;
   epitaxially growing a material crystallographically compatible with said substrate from said substrate in said exposed region of said substrate to a height approximately equal to the thickness of said reflecting structure and then continuing epitaxial growth of said material laterally over said reflecting structure to form an active region; and
   providing appropriate components and metallic contacts over said active region so as to form the light emitting semiconducting structure.

2. A method for forming a light emitting semiconducting structure comprising the following steps:
   providing a substrate of gallium arsenide, silicon, or other material characterized by n-type conductivity;
   patterning a sandwiched reflecting structure which overlays said substrate, said patterned sandwiched reflecting structure comprising a gold reflecting layer disposed between two dielectric layers of silicon oxide, such that a first dielectric layer contacts said substrate, said sandwiched reflecting structure being patterned so as to expose at least one region of said underlying substrate;
   epitaxially growing a material chosen from the group consisting of boron, aluminum, indium, gallium, arsenic, phosphorus, nitrogen in the III-V family of light-emitting compounds, and other III-VI, IV, and IV-VI lighter emitters from said substrate in said exposed region of said substrate to a height roughly equal to the thickness of said sandwiched reflecting structure and then continuing said epitaxial growth in a lateral direction over said sandwiched reflecting structure to from an active region; and
   providing appropriate p-type conductivity contacts over said laterally grown active region.

3. A method for forming a light emitting semiconducting structure as recited in claim 1 wherein said substrate is characterized by p-type conductivity and and said contacts are characterized by n-type conductivity.

4. A method for forming a light emitting semiconducting structure as recited in claim 1 wherein said substrate is silicon, or given a sufficiently small pattern size, an amorphous glass substrate.

5. A method for forming a light emitting semiconducting structure as recited in claim 1 wherein said epitaxially grown material is gallium arsenide,
   indium-gallium-phosphide,
   aluminum-indium-gallium-phosphide,
   indium-gallium-phosphide-arsenide,
   aluminum-indium-gallium-phosphide-arsenide,
   aluminum-gallium-arsenide,
   aluminum-gallium-arsenide-phosphide,
   gallium-arsenide-phosphide, gallium-nitride,
   aluminum-gallium-nitride,
   aluminum-indium-gallium-nitride, aluminum-nitride,
   indium-nitride, indium-gallium-nitride, boron-nitride,
   or any combination thereof.

* * * * *